United States Patent
Jiang et al.

(10) Patent No.: US 11,651,934 B2
(45) Date of Patent: May 16, 2023

(54) SYSTEMS AND METHODS OF CREATING MULTIPLE ELECTRON BEAMS

(71) Applicant: KLA Corporation, Milpitas, CA (US)

(72) Inventors: Xinrong Jiang, Palo Alto, CA (US);
Sameet Shriyan, Milpitas, CA (US);
Luca Grella, Gilroy, CA (US); Kevin Cummings, Milpitas, CA (US);
Christopher Sears, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/490,405

(22) Filed: Sep. 30, 2021

(65) Prior Publication Data
US 2023/0109032 A1 Apr. 6, 2023

(51) Int. Cl.
*H01J 37/09* (2006.01)
*H01J 37/14* (2006.01)
*H01J 37/21* (2006.01)
*H01J 37/28* (2006.01)

(52) U.S. Cl.
CPC .............. *H01J 37/09* (2013.01); *H01J 37/14* (2013.01); *H01J 37/21* (2013.01); *H01J 37/28* (2013.01); *H01J 2237/0453* (2013.01)

(58) Field of Classification Search
CPC .. H01J 37/00; H01J 37/02; H01J 37/09; H01J 37/14; H01J 37/21; H01J 37/26; H01J 37/28; H01J 37/10; H01J 37/143; H01J 37/147; H01J 2237/0453
USPC .............................. 250/306, 307, 311, 492.3
See application file for complete search history.

(56) References Cited

U.S. PATENT DOCUMENTS

| | | |
|---|---|---|
| 3,852,633 A | 12/1974 | Hunter |
| 4,742,234 A | 5/1988 | Feldman et al. |
| 5,215,623 A | 6/1993 | Takahashi et al. |
| 5,262,341 A | 11/1993 | Fueki et al. |
| 5,534,311 A | 7/1996 | Shaw et al. |

(Continued)

FOREIGN PATENT DOCUMENTS

| | | |
|---|---|---|
| NL | 2016853 B1 | 12/2017 |
| NL | 2020465 B1 | 8/2019 |

(Continued)

OTHER PUBLICATIONS

A. Halavanau et al., "Spatial Control of Photoemitted Electron Beams using a Micro-Lens-Array Transverse-Shaping Technique," Phys. Rev. Accel. Beams 20, 103404 (Oct. 26, 2017).

(Continued)

*Primary Examiner* — Jason L McCormack
(74) *Attorney, Agent, or Firm* — Huse IP Law; Charles C. Huse

(57) ABSTRACT

An electron-beam device includes upper-column electron optics and lower-column electron optics. The upper-column electron optics include an aperture array to divide an electron beam into a plurality of electron beamlets. The upper-column electron optics also include a lens array with a plurality of lenses to adjust the focus of the plurality of electron beamlets. Respective lenses of the plurality of lenses are to adjust the focus of respective electron beamlets of the plurality of electron beamlets. The upper-column electron optics further include a first global lens to adjust the focus of the plurality of electron beamlets in a manner opposite to the lens array.

20 Claims, 13 Drawing Sheets

(56) References Cited

U.S. PATENT DOCUMENTS

| | | | |
|---|---|---|---|
| 5,924,277 A | 7/1999 | Beattie et al. | |
| 6,333,508 B1 | 12/2001 | Katsap et al. | |
| 6,617,595 B1 | 9/2003 | Okunuki | |
| 6,768,118 B2 | 7/2004 | Nakayama et al. | |
| 6,768,125 B2 * | 7/2004 | Platzgummer | B82Y 40/00 |
| | | | 250/492.1 |
| 6,822,241 B2 | 11/2004 | Schut et al. | |
| 6,989,546 B2 | 1/2006 | Loschner et al. | |
| 7,015,482 B2 | 3/2006 | Sohda et al. | |
| 7,034,321 B2 | 4/2006 | Takakuwa et al. | |
| 7,067,830 B2 | 6/2006 | Yoda et al. | |
| 7,084,414 B2 | 8/2006 | Wieland et al. | |
| 7,569,833 B2 | 8/2009 | Kruit | |
| 7,868,307 B2 | 1/2011 | Kruit | |
| 8,362,425 B2 | 1/2013 | Han et al. | |
| 8,637,834 B2 | 1/2014 | Knippelmeyer et al. | |
| 8,648,318 B2 | 2/2014 | Kruit et al. | |
| 8,890,094 B2 | 11/2014 | Wieland et al. | |
| 9,607,806 B2 | 3/2017 | Zonnevylle et al. | |
| 9,922,796 B1 | 3/2018 | Frosien et al. | |
| 10,242,839 B2 | 3/2019 | Brodie | |
| 10,312,052 B2 | 6/2019 | Kruit | |
| 10,395,887 B1 | 8/2019 | Kruit et al. | |
| 10,453,645 B2 | 10/2019 | Frosien et al. | |
| 10,497,536 B2 | 12/2019 | Brodie | |
| 10,504,687 B2 | 12/2019 | Kruit et al. | |
| 10,748,739 B2 | 8/2020 | Jiang et al. | |
| 10,903,042 B2 | 1/2021 | Kruit et al. | |
| 11,056,312 B1 | 7/2021 | Jiang et al. | |
| 2003/0001095 A1 | 1/2003 | Lo et al. | |
| 2008/0023643 A1 | 1/2008 | Kruit et al. | |
| 2008/0230711 A1 * | 9/2008 | Platzgummer | B82Y 10/00 |
| | | | 250/492.22 |
| 2012/0211677 A1 | 8/2012 | Kruit et al. | |
| 2012/0295203 A1 * | 11/2012 | Sano | B82Y 40/00 |
| | | | 430/296 |
| 2017/0025241 A1 * | 1/2017 | Li | H01J 37/28 |
| 2017/0229279 A1 | 8/2017 | Brodie et al. | |
| 2018/0254167 A1 * | 9/2018 | Zhao | H01J 37/222 |
| 2020/0051779 A1 | 2/2020 | Ren et al. | |
| 2020/0126752 A1 | 4/2020 | Brodie | |
| 2020/0273667 A1 | 8/2020 | Mohammadi-Gheidari et al. | |
| 2022/0130640 A1 | 4/2022 | Fritz et al. | |
| 2022/0139665 A1 | 5/2022 | Schubert et al. | |

FOREIGN PATENT DOCUMENTS

| | | |
|---|---|---|
| WO | 2021018332 A1 | 2/2021 |
| WO | 2021078352 A1 | 4/2021 |

OTHER PUBLICATIONS

PCT/US2022/043559, International Search Report, dated Jan. 4, 2023.

PCT/US2022/043559, Written Opinion of the International Searching Authority, dated Jan. 4, 2023.

* cited by examiner

1100

```
┌─────────────────────────────────────────────────────────────────────────────┐
│ Divide an electron beam into a plurality of electron beamlets using an       │
│ aperture array. (1102)                                                       │
└─────────────────────────────────────────────────────────────────────────────┘
                                       │
                                       ▼
┌─────────────────────────────────────────────────────────────────────────────┐
│ Adjust the focus of the plurality of electron beamlets using a lens array    │
│ that includes a plurality of lenses: use respective lenses of the plurality  │
│ of lenses to adjust the focus of respective electron beamlets of the         │
│ plurality of electron beamlets. (1104)                                       │
│  ┌───────────────────────────────────────────────────────────────────────┐   │
│  │ Defocus the plurality of electron beamlets. (1106)                     │   │
│  └───────────────────────────────────────────────────────────────────────┘   │
│  ┌───────────────────────────────────────────────────────────────────────┐   │
│  │ Focus the plurality of electron beamlets. (1108)                       │   │
│  └───────────────────────────────────────────────────────────────────────┘   │
└─────────────────────────────────────────────────────────────────────────────┘
                                       │
                                       ▼
┌─────────────────────────────────────────────────────────────────────────────┐
│ Adjust the focus of the plurality of electron beamlets using a first global  │
│ lens. The first global lens adjusts the focus of the plurality of electron   │
│ beamlets in a manner opposite to the lens array. (1110)                      │
│  ┌───────────────────────────────────────────────────────────────────────┐   │
│  │ Focus the plurality of electron beamlets as defocused by the lens      │   │
│  │ array. (1112)                                                           │   │
│  └───────────────────────────────────────────────────────────────────────┘   │
│  ┌───────────────────────────────────────────────────────────────────────┐   │
│  │ Defocus the plurality of electron beamlets as focused by the lens      │   │
│  │ array. (1114)                                                           │   │
│  └───────────────────────────────────────────────────────────────────────┘   │
└─────────────────────────────────────────────────────────────────────────────┘
                                       │
                                       ▼
┌─────────────────────────────────────────────────────────────────────────────┐
│ Collimate the plurality of electron beamlets. (1116)                         │
└─────────────────────────────────────────────────────────────────────────────┘
                                       │
                                       ▼
┌─────────────────────────────────────────────────────────────────────────────┐
│ Provide the collimated plurality of electron beamlets to lower-column        │
│ electron optics of the electron-beam device. (1118)                          │
└─────────────────────────────────────────────────────────────────────────────┘
```

FIG. 11

SYSTEMS AND METHODS OF CREATING MULTIPLE ELECTRON BEAMS

TECHNICAL FIELD

This disclosure relates to electron optics, and more specifically to creating multiple electron beams in an electron-beam device.

BACKGROUND

Scanning electron microscopes (SEMs) have long been used for inspection applications such as semiconductor-wafer inspection. Traditionally, SEMs have had a single electron beam. But more recently, SEMs with multiple electron beams (i.e., beamlets) have been developed (e.g., using an array of Einzel lenses or deflecting dipoles). The throughput of a SEM (or other electron-beam device) depends on the number of beamlets: the higher the number of beamlets, the higher the throughput.

Increasing the number of beamlets, however, presents significant challenges. For example, the number of beamlets may be limited by poor optical resolution and high electric-field strengths that increase the risk of arcing. And these challenges may be at odds with each other. For example, the electron-beam energy may be reduced to reduce the electric-field strength and thus the risk of arcing. But the reduced electron-beam energy increases Coulomb interactions between electrons, thereby reducing the resolution.

SUMMARY

In some embodiments, an electron-beam device includes upper-column electron optics and lower-column electron optics. The upper-column electron optics include an aperture array to divide an electron beam into a plurality of electron beamlets. The upper-column electron optics also include a lens array with a plurality of lenses to adjust the focus of the plurality of electron beamlets. Respective lenses of the plurality of lenses are to adjust the focus of respective electron beamlets of the plurality of electron beamlets. The upper-column electron optics further include a first global lens to adjust the focus of the plurality of electron beamlets in a manner opposite to the lens array.

In some embodiments, a method is performed in the upper-column electron optics of an electron-beam device. The method includes dividing an electron beam into a plurality of electron beamlets using an aperture array. The method also includes adjusting the focus of the plurality of electron beamlets using a lens array that includes a plurality of lenses. Adjusting the focus of the plurality of electron beamlets includes using respective lenses of the plurality of lenses to adjust the focus of respective electron beamlets of the plurality of electron beamlets. The method further includes adjusting the focus of the plurality of electron beamlets using a first global lens. The first global lens adjusts the focus of the plurality of electron beamlets in a manner opposite to the lens array.

BRIEF DESCRIPTION OF THE DRAWINGS

For a better understanding of the various described embodiments, reference should be made to the Detailed Description below, in conjunction with the following drawings.

FIG. 11 is a flowchart illustrating a method of creating multiple electron beams in an electron-beam device, in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

In electron optics, lensing action is provided by electric and/or magnetic fields. Both those fields and the components used to generate those fields are referred to herein as lenses, depending on the context. A particular component may be part of multiple lenses. For example, a particular component may be both the final component of a first lens and the initial component of a second lens.

Figure 1:
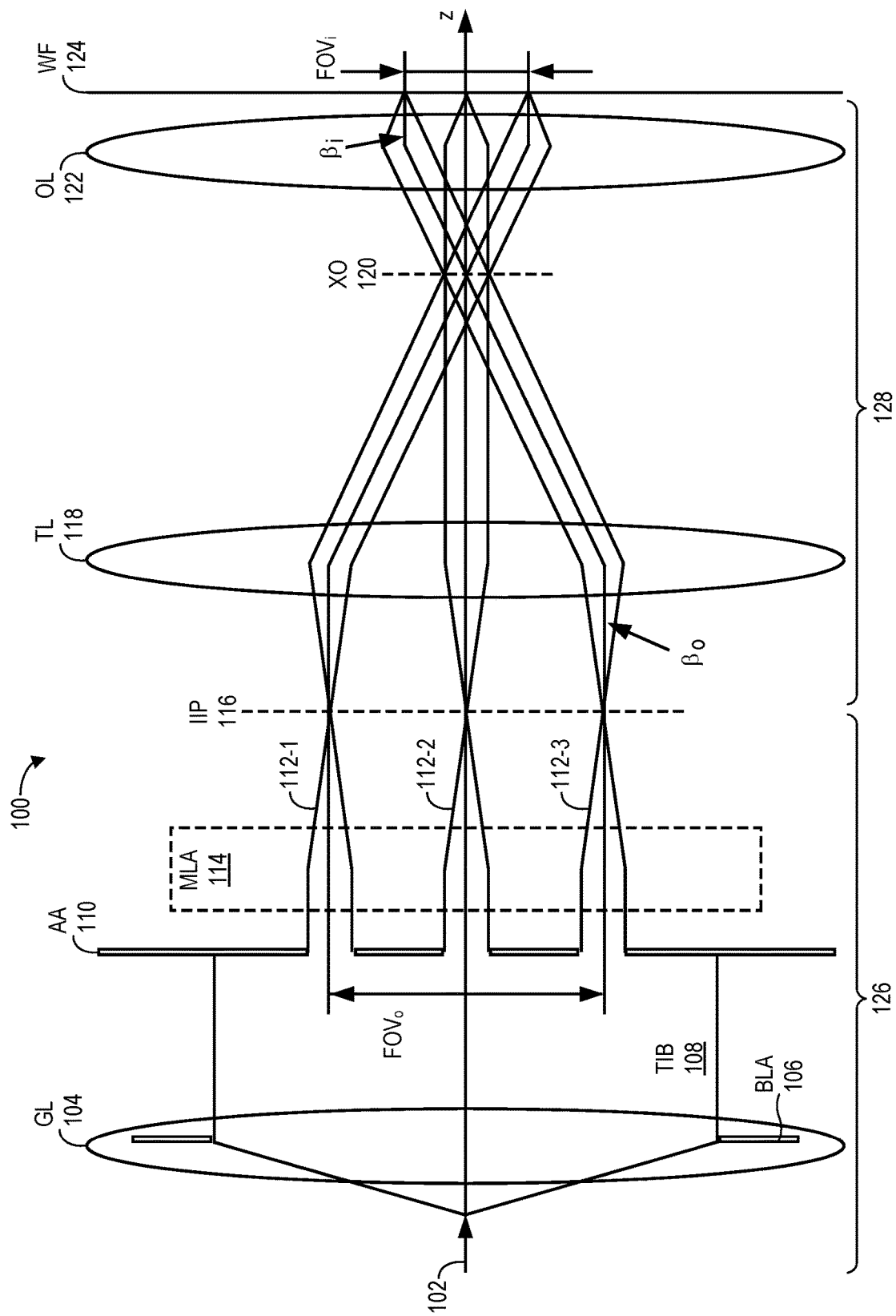
FIG. 1 shows an electron-beam device that generates multiple electron beams (i.e., multiple beamlets).

FIG. 1 shows an electron-beam device 100 that generates multiple electron beams (i.e., beamlets). The electron-beam device 100 includes upper-column electron optics 126 and lower-column electron optics 128. The upper-column electron optics 126 include optics for forming a plurality of electron beamlets 112. In the upper-column electron optics 126, an electron source (e.g., a thermal-field emission (TFE) or cold-filed emission (CFE) source) emits electrons from an emitter tip 102. A gun lens (GL) 104 focuses the electrons into an electron beam 108: the gun lens 104 collimates the electrons emitted by the emitter tip 102 into a telecentric illumination beam (TIB) 108 that illuminates an aperture array (AA) 110. A beam-limiting aperture (BLA) 106 selects the current of the electron beam 108 that illuminates the aperture array 110. The beam-limiting aperture is disposed between the emitter tip 102 and the aperture array 110 along the optical axis z, as is the gun lens 104. The aperture array 110 divides the electron beam 108 into the plurality of electron beamlets 112 (three electron beamlets 112-1 through 112-3 are shown in FIG. 1 for simplicity) by allowing the electron beamlets 112 to pass through respective apertures in the aperture array 110 while blocking the remainder of the electron beam 108. A lens array 114, also referred to as a micro-lens array (MLA), follows the aperture array 110. The lens array 114 includes a plurality of lenses, each of which focuses a respective electron beamlet 112 of the plurality of electron beamlets 112 onto an intermediate image plane (IIP) 116. The plurality of electron beamlets 112 has a field of view $FOV_o$ in the intermediate image plane 116, with each electron beamlet 112 having a numerical aperture (NA) of Po.

The lower-column electron optics 128 include a transfer lens (TL) 118 and an objective lens (OL) 122. The transfer lens 118 is configured to produce a cross-over (xo) 120 of the plurality of electron beamlets 112 between the transfer lens 118 and the objective lens 122. The lower-column electron optics 128 are projection optics. For example, the plurality of electron beamlets 112 are projected by the transfer lens 118 and the objective lens 122 onto a wafer (WF) 124 (or other substrate) for inspection (e.g., with an optimal magnification at which the beam blurs for the plurality of electron beamlets 112 are minimized at the wafer 124). The plurality of electron beamlets 112 has a field of view $FOV_i$ on the surface of the wafer 124, with each electron beamlet 112 having a numerical aperture (NA) of $\beta_i$. For inspection of the wafer 124 (or other substrate), secondary electrons (SE) and/or back-scatted electrons emitted from the wafer 124 due to bombardment of the wafer 124 by the plurality of electron beamlets 112 may be split from the optical axis and deflected towards a detection system (not shown) by a Wien filter (not shown).

Figure 2:
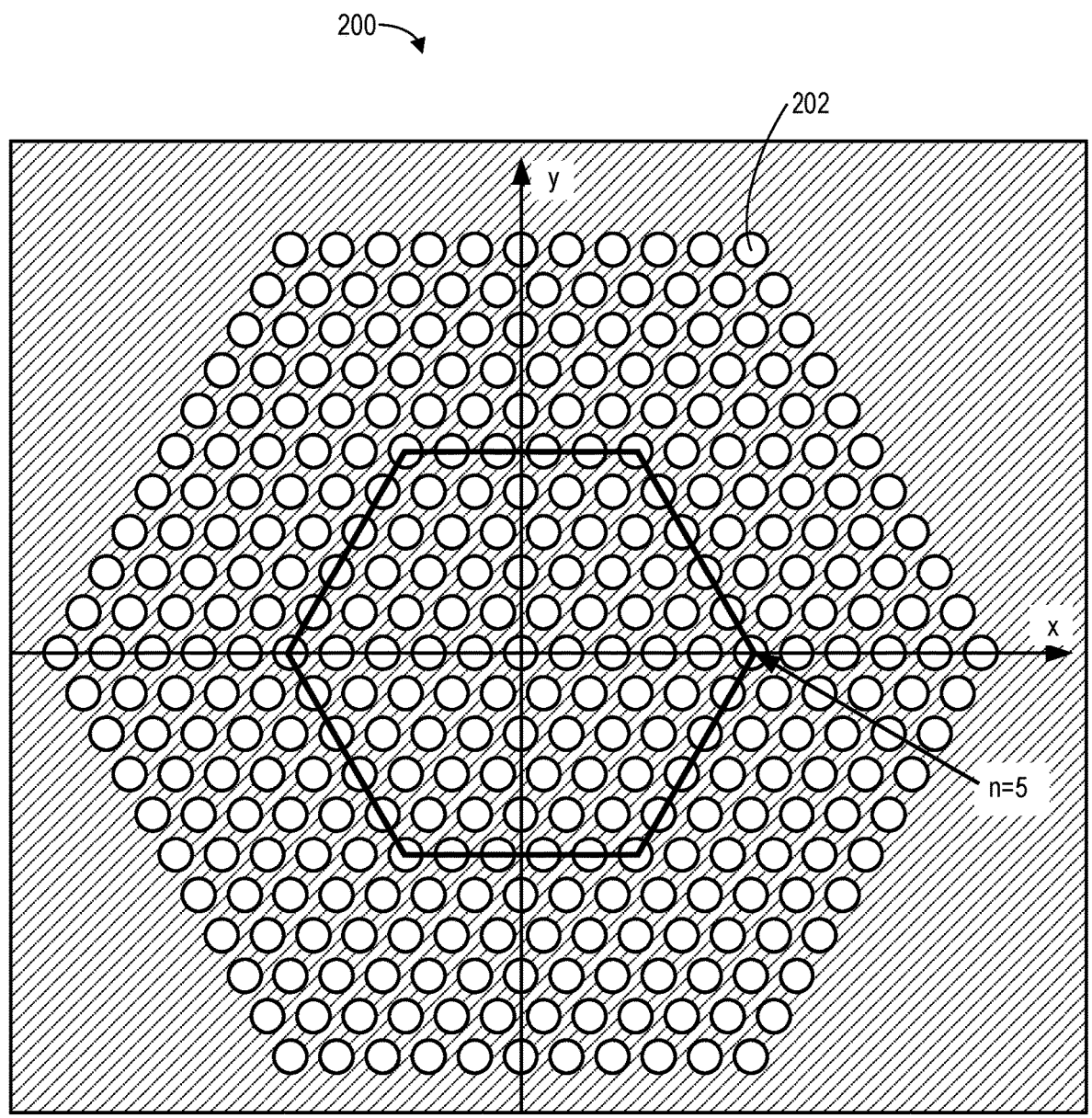
FIG. 2 shows a plate that may be used in an electron-beam device that generates multiple electron beams.

FIG. 2 shows a plate 200 that may be used in an electron-beam device that generates multiple electron beams. For example, the plate 200 may be an example of the aperture array 110 of the electron-beam device 100 (FIG. 1). The plate 200 is disposed in the x-y plane, perpendicular to the optical axis (i.e., the z-axis). The plate 200 includes an array of apertures 202. The apertures 202 may also be referred to as bores or holes. (As used herein, the terms "aperture," "bore," and "hole" are interchangeable.) The apertures 202 may be circular. The plate 200 is conductive (e.g., metallic), such that the plate 200 may serve as an electrode in the electron-beam device.

In some embodiments, the apertures 202 are distributed in a hexagonal pattern, which is desirable because a hexagon has a relatively high degree of rotational symmetry. Alternatively, the apertures 202 are distributed in a different pattern (e.g., with a different degree of rotational symmetry). The size (e.g., diameter) of each aperture 202 determines the current of a corresponding electron beamlet 112. The number of apertures 202 determines the number of electron beamlets 112 in the plurality of electron beamlets 112. For the hexagonal pattern of FIG. 2, the total number $MEB_{tot}$ of electron beamlets 112 in the plurality of electron beamlets 112 is:

$$MEB_{tot} = \frac{1}{4}(1 + 3M_x^2) \tag{1}$$

where $M_x$ is the number of apertures 202 along an axis (e.g., the x-axis) of the hexagon. For example, within five rings (i.e., $M_x=11$) of the hexagonally-distributed apertures 202 in FIG. 2, the total number of beamlets 112 is 91 (i.e., $MEB_{tot}=91$). Within the full 10 rings of FIG. 2 (i.e., $M_x=21$), the total number of beamlets 112 is 331 (i.e., $MEB_{tot}=331$).

The arrangement of the circles in FIG. 2 may also show the pattern of the plurality of electron beamlets 112 in the intermediate image plane 116 and in the plane of the wafer 124 (e.g., on the surface of the wafer 124) (FIG. 1). From the intermediate image plane 116 to the plane of the wafer 124, the field of view of the plurality of electron beamlets 112 is demagnified by 1/M, where:

$$M=FOV_i/FOV_o=(\beta_o/\beta_i)*(BE/LE)^{1/2} \tag{2}$$

where BE and LE are the beam energy and the landing energy, respectively, of the plurality of electron beamlets 112. Also, $$FOV_o=2np \tag{3}$$

where n in the number of hexagonal rings of electron beamlets 112 (and thus of apertures 202) and p is the spacing between electron beamlets 112.

To improve the ultimate focusing of the electron beamlets 112 (e.g., to reduce spherical aberrations), the electron-beam device 100 may be replaced with an electron-beam device that uses a defocusing lens array to defocus the plurality of electron beamlets and uses a first global lens (also referred to as a global imaging lens or GIL) to focus the plurality of electron beamlets onto an intermediate image plane. The defocusing lens array thus adjusts the focus of the plurality of electron beamlets in a first manner (i.e., by defocusing them) and the first global lens thus adjusts the focus of the plurality of electron beamlets in a second manner that is opposite to the first manner (i.e., by focusing them).

Figure 3:
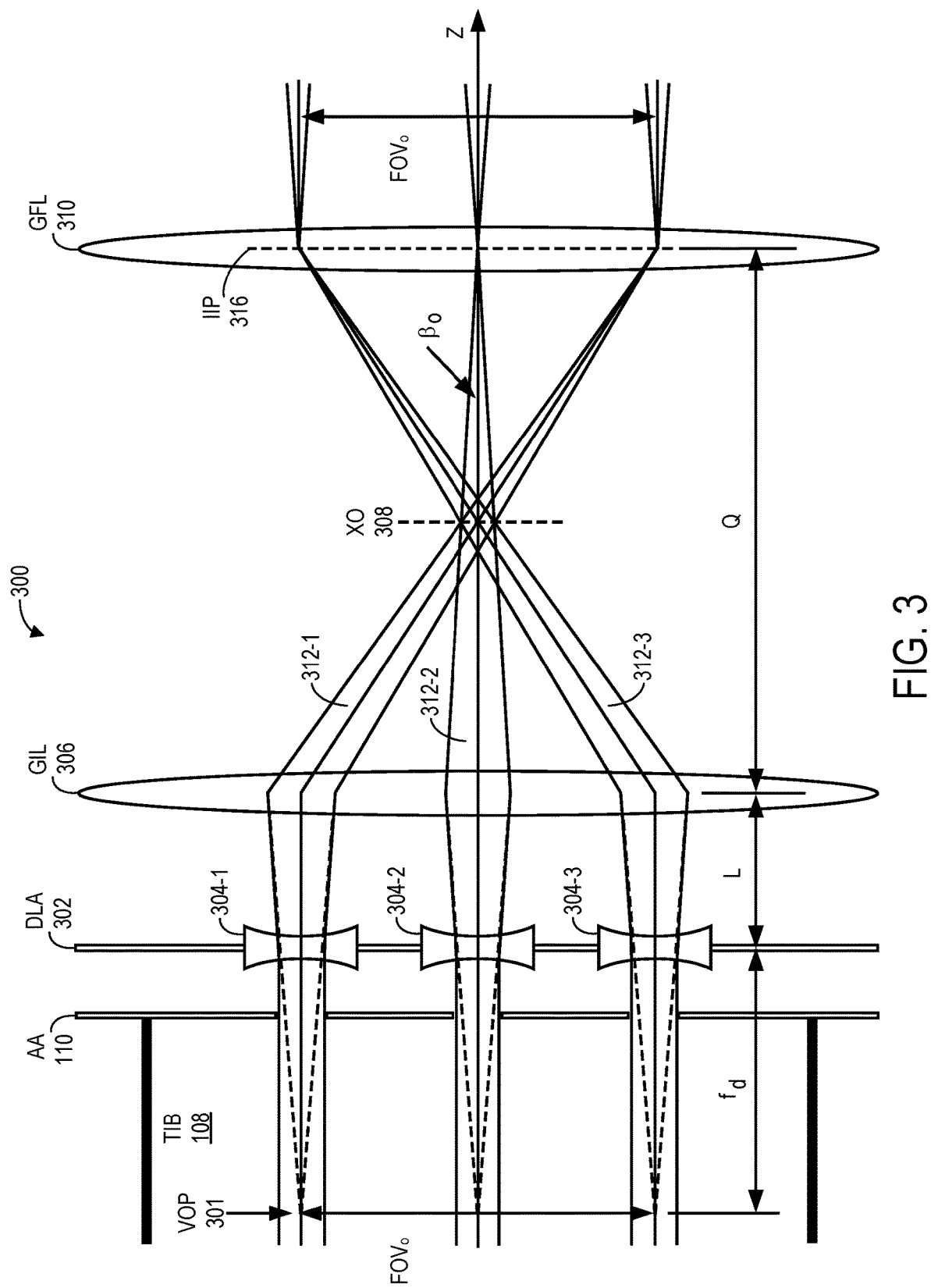
FIG. 3 shows a portion of the upper-column electron optics of an electron-beam device (e.g., SEM) that generates multiple electron beams, uses a defocusing lens array to defocus the electron beams, and uses a global imaging lens to focus the electron beams onto an intermediate image plane in accordance with some embodiments.

FIG. 3 shows a portion of the upper-column electron optics 300 of such an electron-beam device (e.g., SEM) in accordance with some embodiments. In the upper-column electron optics 300, the aperture array 110 (e.g., the plate 200, FIG. 2) divides the electron beam 108, which is a telecentric illumination beam (TIB) and thus is collimated, into a plurality of electron beamlets 312 with trajectories parallel to the optical axis. (Three electron beamlets 312-1 through 312-3 are shown in FIG. 3 for simplicity. The upper-column electron optics 300 may also include the emitter tip 102, gun lens 104, and beam-limiting aperture 106 of FIG. 1, which are not shown in FIG. 3 for simplicity.) The electron beamlets 312 are then separately defocused by respective defocusing lenses 304 in a defocusing lens array (DLA) 302. (Three lenses 304-1 through 304-3 corresponding to the electron beamlets 312-1 through 312-3 are shown in FIG. 3 for simplicity.) A first global lens (i.e., GIL) 306 then focuses and deflects the defocused electron beamlets 312. The deflected electron beamlets 312 form a crossover 308 and then an image at an intermediate image plane 316. A second global lens 310 (also referred to as a global field lens or GFL) collimates the deflected electron beamlets 312 to telecentrically illuminate the lower-column electron optics 128 (FIG. 1, not shown in FIG. 3).

The defocusing lens array 302 is disposed between the aperture array 110 and the first global lens 306 along the optical axis. The first global lens 306 is disposed between the defocusing lens array 302 and the second global lens 310 along the optical axis. The second global lens 310 is disposed between the first global lens 306 and the lower-column electron optics 128 (FIG. 1) along the optical axis. The crossover 308 occurs between the first global lens 306 and the second global lens 310 (and also between the first global lens 306 and the intermediate image plane 316) along the optical axis.

The upper-column electron optics 300 may be considered as projection optics, in which the object plane is the virtual object plane (VOP) 301 and the image plane is the intermediate image plane 316. The virtual object plane 301 is the image plane of the defocusing lenses 304 in the defocusing lens array 302, as shown with dotted lines in FIG. 3. The image-forming relation of an electron beamlet 312 in the upper-column electron optics 300 may be given by:

$$\frac{1}{f_d + L} + \frac{1}{Q} = \frac{1}{f_g} \quad (4)$$

where $f_d$ is the focal length of the defocusing lenses 304, L is the distance between the defocusing lens array 302 and the first global lens 306, Q is the distance between the first global lens 306 and the intermediate image plane 316, and $f_g$ is the focal length of the first global lens 306.

In some embodiments, the optical magnification of the upper-column electron optics 300 is approximately 1× (e.g., is exactly 1×, with the field of view in the virtual object plane 301 equal to the field of view in the intermediate image plane 316). The numeric aperture (NA) may be given by:

$$\beta_o = \frac{D_{AA}}{2Mf_d} \quad (5)$$

where M is the optical magnification of the projection optics and $D_{AA}$ is the diameter of an aperture in the aperture array 110 (e.g., of an aperture 202, FIG. 2).

Figure 4A:
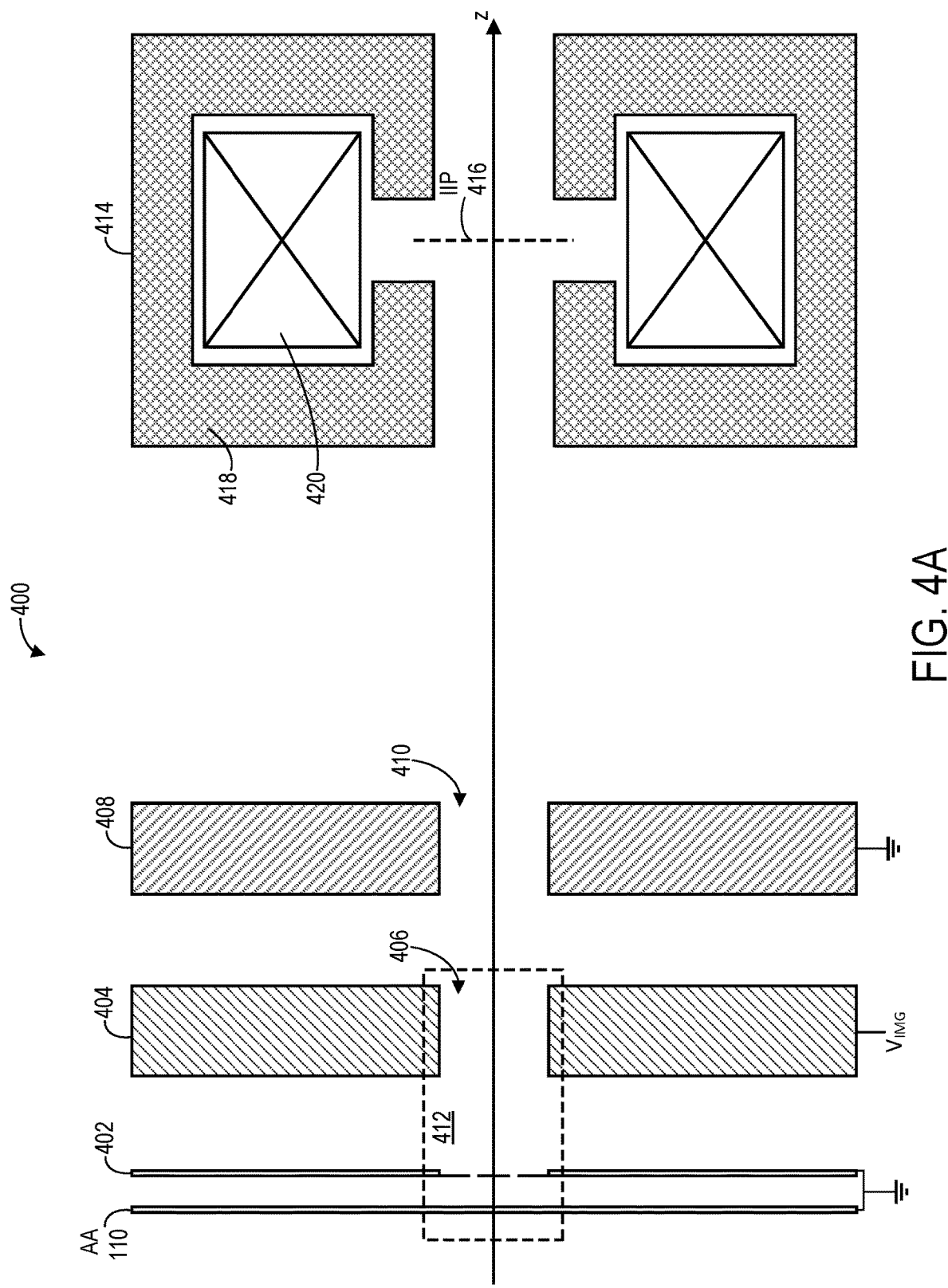
FIG. 4A shows a portion of an example of the upper-column electron optics of FIG. 3, in accordance with some embodiments.

FIG. 4A shows a portion of upper-column electron optics 400 in accordance with some embodiments. The upper-column electron optics 400 may be an example of the upper-column electron optics 300 (FIG. 3), in accordance with some embodiments. The upper-column electron optics 400 include the aperture array 110 and may also include the emitter tip 102, gun lens 104, and beam-limiting aperture 106 (FIG. 1, not shown in FIG. 4). In addition to the aperture array 110, the upper-column electron optics 400 include a first plate 402, a second plate 404, and a third plate 408 arranged sequentially along the optical axis, with each plate perpendicular to the optical axis. The first plate 402 is disposed between the aperture array 110 and the second plate 404. The second plate 404 is disposed between the first plate 402 and the third plate 408. The first plate 402 and the second plate 404 are an example of the defocusing lens array 302 (FIG. 3). The second plate 404 and the third plate 408 are an example of the first global lens 306 (FIG. 3). The second plate 404 and the third plate 408 have respective bores 406 and 410 to allow passage of the plurality of beamlets 312 (FIG. 3): during operation, all of the beamlets 312 pass through the bores 406 and 410, in accordance with some embodiments. The second plate 404 and the third plate 408 thus are single-bore plates. In some embodiments, the bores 406 and 410 have diameters of 10 mm or larger, to ensure effective removal of spherical aberration of the beamlets 312 (e.g., which have a size of tens of microns).

The upper-column electron optics 400 also include a magnetic lens 414 that is an example of the second global lens 310. The magnetic lens 414 includes a pole piece 418 and coils 420. An intermediate image plane 416 is located in the middle of the magnetic lens 414, perpendicular to the optical axis. The intermediate image plane 416 is an example of the intermediate image plane 316 (FIG. 3). The magnetic lens 414 is disposed between the third plate 408 and lower-column electron optics 128 (FIG. 1, not shown in FIG. 4A) along the optical axis.

Figure 4B:
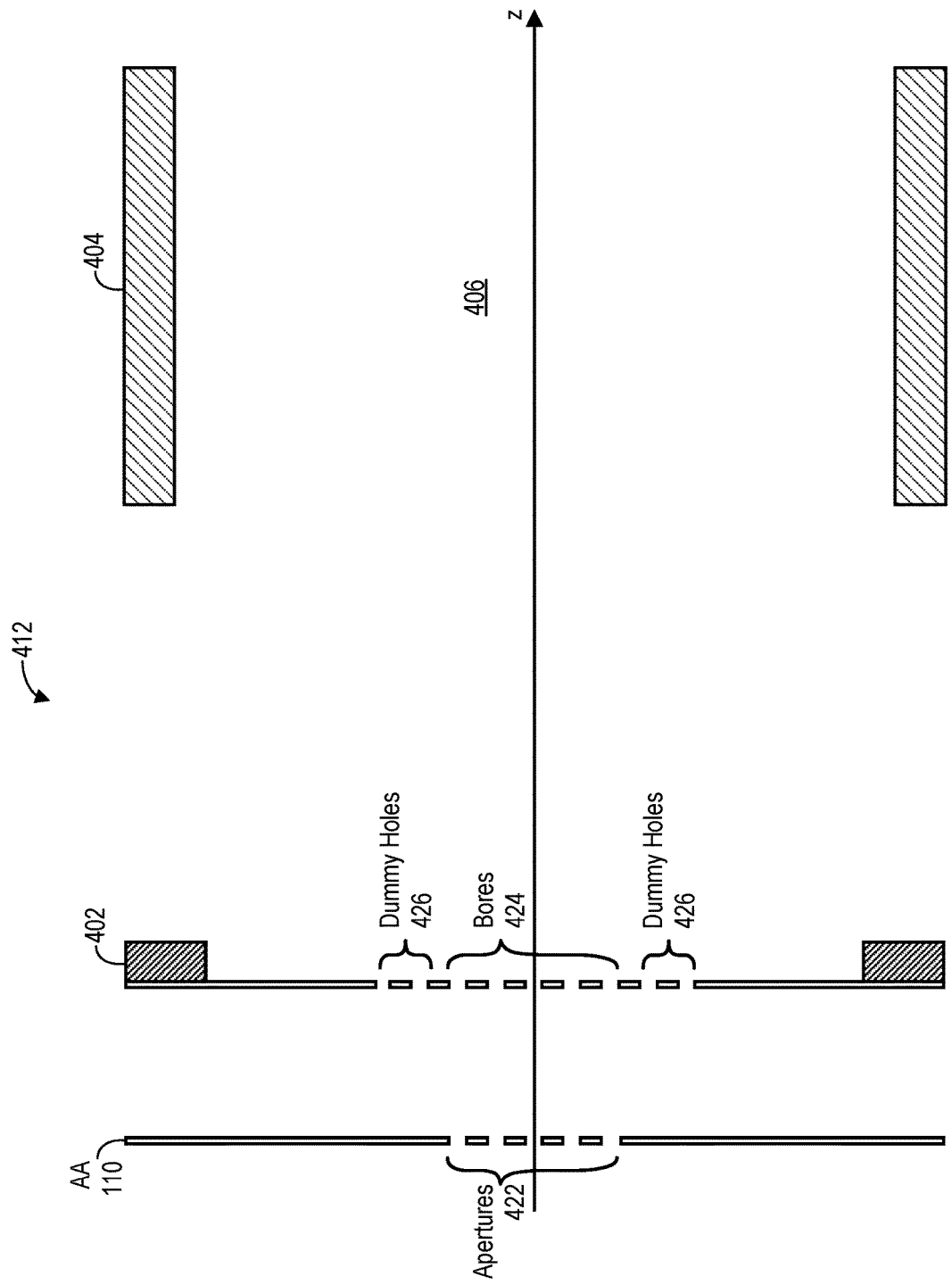
FIG. 4B is a zoomed-in view of a region of the upper-column electron optics of FIG. 4A, in accordance with some embodiments.

FIG. 4B is a zoomed-in view of a region 412 (FIG. 4A) of the upper-column electron optics 400, in accordance with some embodiments. As shown in FIG. 4B, the aperture array 110 has a plurality of apertures 422 (e.g., apertures 202, FIG. 2), each of which corresponds to a respective electron beamlet 312 (FIG. 3). Each electron beamlet 312 passes through, and is thus created by, a respective aperture 422. The first plate 402 has a plurality of bores 424 that correspond to respective apertures 422 in the aperture array 110: respective electron beamlets 312 pass through respective bores 424. The first plate 402 thus is a multi-bore plate. The plate 200 (FIG. 2) may be an example of the first plate 402, with the apertures 202 being the bores 424. In some embodiments, the plurality of bores 424 are aligned with respective apertures 422 (i.e., each bore 424 is aligned with a respective aperture 422). The plurality of bores 424 may have a bore size (e.g., the diameter of each bore 424) that is larger than an aperture size of the apertures 422 (e.g., the diameter of each aperture 422). An example of the aperture size of the apertures 422 is 50 um, with 100 um spacing between the apertures 422. Other examples are possible.

In some embodiments, the plurality of bores 424 are surrounded by dummy holes 426 in the first plate 402. The dummy holes 426 are outer bores that do not correspond to respective apertures 422, such that electron beamlets 312 do not pass through the dummy holes 426. The bores 424 may also be referred to as effective holes, in contrast to the dummy holes 426. The dummy holes 426 are used to ensure that electric field distributions for the bores 424 are homogeneous.

The first plate 402, second plate 404, and third plate 408 are conductive (e.g., metallic) plates that serve as respective electrodes. To achieve the desired defocusing by the defocusing lens array 302 and focusing by the first global lens 306 (FIG. 3), the aperture array 110, first plate 402, and third plate 408 are grounded, while the second plate 404 is biased with a negative imaging voltage $V_{IMG}$ (FIG. 4A) (e.g., in the range of −17 kV to −24 kV, with a beam energy of approximately 30 kV). The second plate 404 is thus configurable to be negatively biased, in accordance with some embodiments. The second plate 404 may be separated from the first plate 402 by 6-12 mm and from the third plate 408 by 6-12 mm along the optical axis. These gaps result in relatively low electrical-field strengths between the plates and thus reduce or avoid the risk of arcing. Also, this design allows the first global lens 306 to be implemented using a single, global voltage $V_{IMG}$.

Figure 4C:
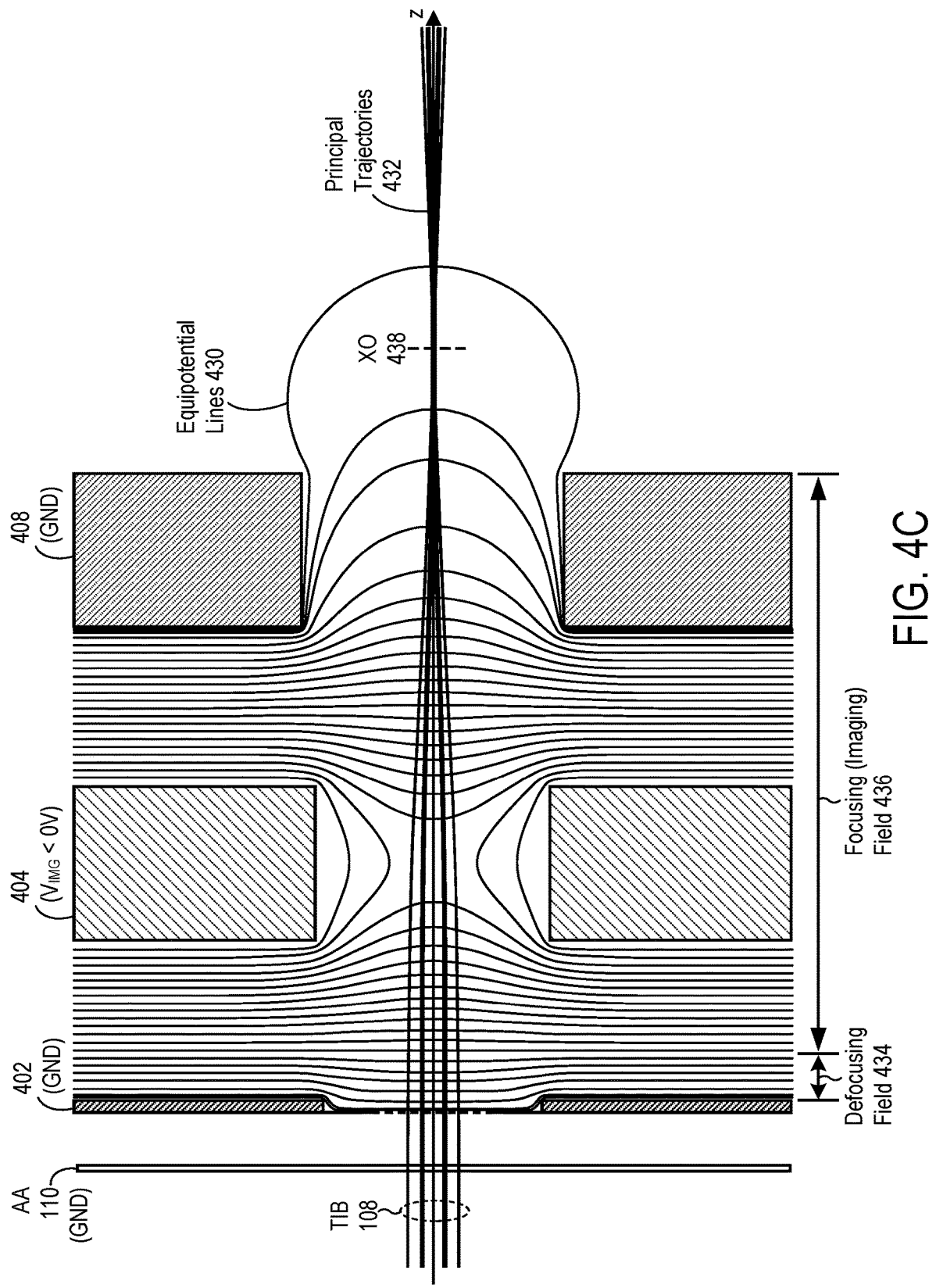
FIG. 4C shows computer simulations of equipotential lines and principal trajectories of electron beamlets for the upper-column electron optics of FIGS. 4A and 4B, in accordance with some embodiments.

FIG. 4C shows computer simulations of equipotential lines 430 and principal trajectories 432 of electron beamlets 312 for the upper-column electron optics 400, in accordance with some embodiments. Components of the upper-column electron optics 400 are biased as shown in FIG. 4A. The first plate 402 and second plate 404 give rise to a defocusing field 434, and the second plate 404 and third plate 408 give rise to a focusing (i.e., imaging) field 436. The defocusing field 434 and focusing field 436 are electric fields. Computer simulation verifies that the resulting electron beamlets 132 (i.e., the electron beamlets 132 with the principal trajectories 432) have negligible spherical aberration and negligible Coulomb interactions. Coulomb interactions are negligible because the crossover position 438 (between the third plate 408 and the magnetic lens 414) is in a free-field space with negative potentials, such that the energy of the electron beamlets 132 around the crossover position 438 is not reduced, and because the crossover angle is fairly large compared to the numerical aperture of the electron beamlets 132. The upper-column electron optics 400 thus produce a plurality of electron beamlets 132 with negligible blurring due to spherical aberration and Coulomb interactions.

Figure 5:
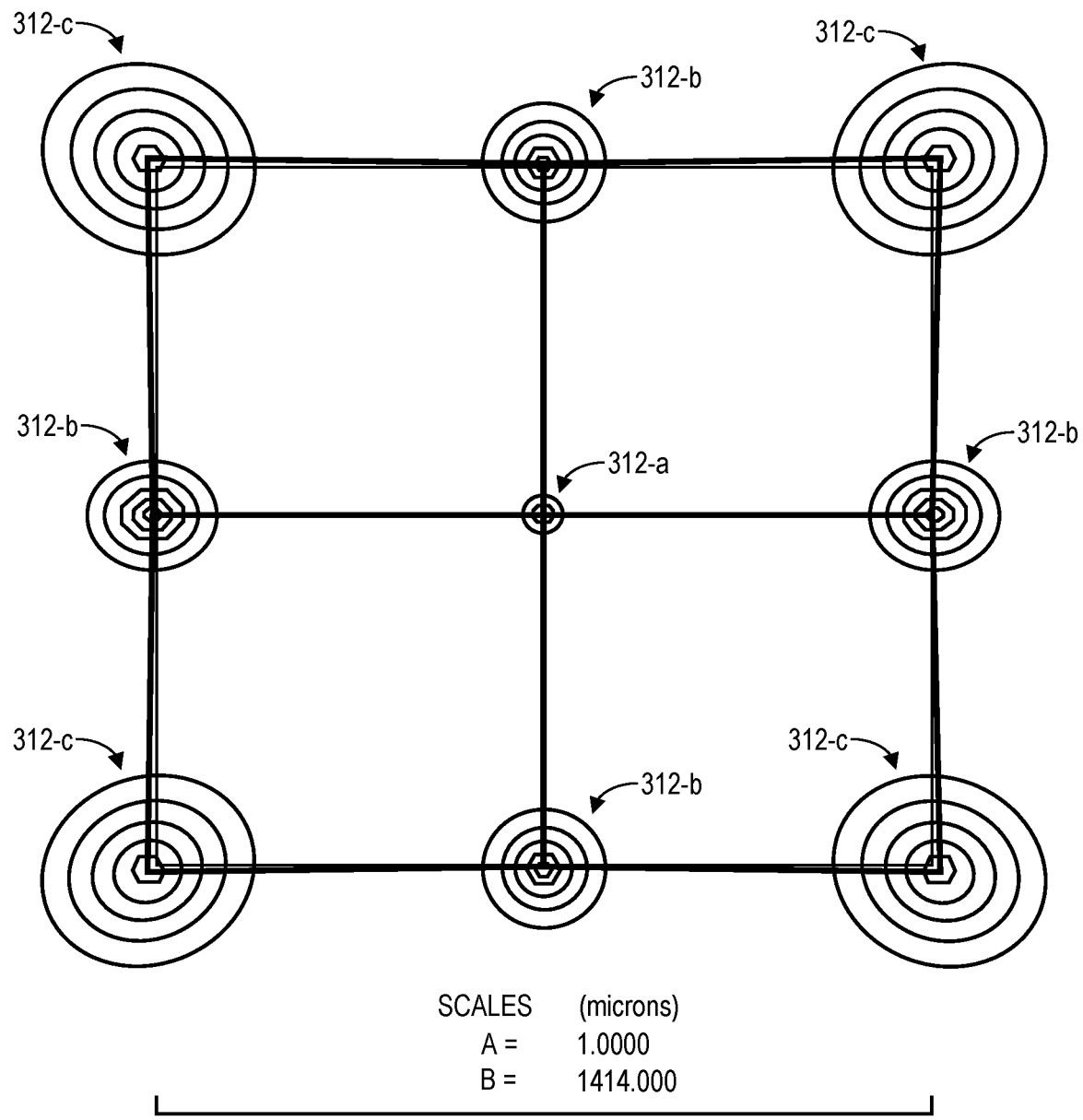
FIG. 5 shows field-curvature blurs for beamlets generated using the upper-column electron optics of FIGS. 4A-4C, in accordance with some embodiments.

The upper-column electron optics 400, however, may suffer from blurring caused by field curvature across a large field of view. Field curvature in the intermediate image plane 316 (FIG. 3) (e.g., in the intermediate image plane 416, FIG. 4A) results from deflection of electron beamlets 312 that are off-axis (i.e., are off the optical axis). FIG. 5 shows field-curvature blurs in the intermediate image plane 416 (FIG. 4) across a field of view for a defocusing lens array 302 with 331 electron beamlets 312 as implemented in accordance with the plate 200 (FIG. 2) and the upper-column electron optics 400 (FIGS. 4A-4C), with 50 um aperture sizing and 100 um aperture spacing, in accordance with some embodiments. The field of view is thus 1414 um×1414 um. The field-curvature blurs of FIG. 5 are determined by computer simulation. FIG. 5 shows field-curvature blurs for a central electron beamlet 312-a, the farthest electron beamlets 312-b along the x- and y-axes, and the farthest-corner electron beamlets 312-c. FIG. 5 has two scales: a first scale for the electron distribution in each electron beamlet 312 and a second, larger scale for the distance between the electron beamlets 312. The five rings for each electron beamlet 312 show the 20%, 40%, 60%, 80%, and 100% electron distributions for the electron beamlet 312 (i.e., 20% of the electrons for the electron beamlet 312 are within the first ring, 40% are within the second ring, and so on). As FIG. 5 shows, the farthest-corner electron beamlets 312-c have larger spot sizes than the farthest electron beamlets 312-b along the x- and y-axes, which have larger spot sizes than the electron central beamlet 312-a.

To help correct the field-curvature blurs of FIG. 5, two multi-bore plates are used instead of a single multi-bore plate, in accordance with some embodiments. A first multi-bore plate is grounded and an auxiliary voltage $V_{FCC}$ (also referred to as a field-curvature correction voltage) is applied to the second multi-bore plate. $V_{FCC}$ is referred to as an auxiliary voltage because it is distinct from $V_{IMG}$. The magnitude of $V_{FCC}$ may be on the order of hundreds of volts (e.g., in a range between 0-1 kV).

Figure 6:
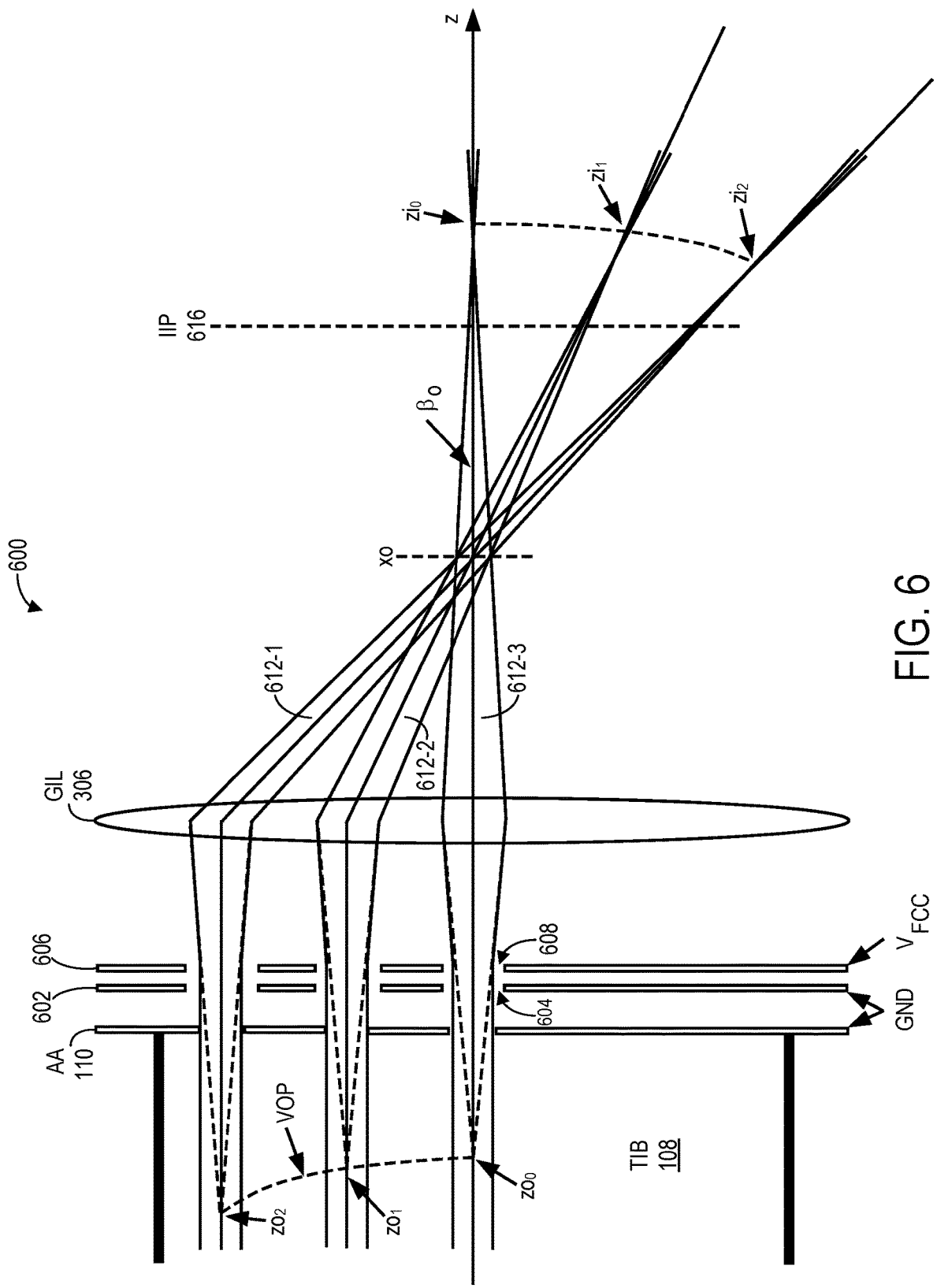
FIG. 6 shows a portion of upper-column electron optics with an aperture array, a first multi-bore plate, a second multi-bore plate, and a global imaging lens, in accordance with some embodiments.

FIG. 6 shows a portion of upper-column electron optics 600 of an electron-beam device (e.g., SEM) with the aperture array 110, a first plate 602, and a second plate 606, in accordance with some embodiments. The first plate 602 is disposed between the aperture array 110 and the second plate 606 along the optical axis. The first plate 602 may be separated from the second plate 606 by a gap along the optical axis on the order of tens of microns.

The first plate 602 and the second plate 606 are both conductive (e.g., metallic) multi-bore plates: the first plate 602 has a first plurality of bores 604 and the second plate 606 has a second plurality of bores 608. The first plurality of bores 604 corresponds to respective apertures (e.g., apertures 422, FIG. 4B) in the aperture array 110. The second plurality of bores 608 corresponds to the first plurality of bores 604 and to the respective apertures in the aperture array 110. The second plurality of bores 608 and the first plurality of bores 604 thus have the same number of bores. For example, the first plurality of bores 604 and the second plurality of bores 608 are aligned with each other and with respective apertures in the aperture array 110 (i.e., each bore 608 is aligned with a respective bore 604 and a respective aperture.) A respective bore 604 (e.g., each bore 604) and a respective bore 608 (e.g., each bore 608) may have a bore size that is larger than the aperture size of a corresponding aperture in the aperture array 110 (e.g., of the aperture with which they are aligned). An example of the aperture size is 50 um, with 100 um spacing between the apertures 422. Other examples are possible. Each bore 608 in the second plurality of bores 608 may have the same bore size as a corresponding bore 604 in the plurality of bores 604. The first plurality of bores 604 and the second plurality of bores 608 may each be surrounded by respective dummy holes 426 (FIG. 4B) in the first and second plates 602 and 606.

The upper-column electron optics 600 may also include the emitter tip 102 (FIG. 1), the gun lens 104 (FIG. 1), the beam-limiting aperture 106 (FIG. 1), the first global lens 306 (FIG. 3), and the second global lens 310 (FIG. 3). (The emitter tip 102, gun lens 104, beam-limiting aperture 106, and second global lens 310 are not shown in FIG. 6 for simplicity.) The electron-beam device that includes the upper-column electron optics 600 (e.g., a SEM) may also include the lower-column electron optics 128 (FIG. 1). The magnetic lens 414 may be used to implement the second global lens 310.

The first global lens 306 may be implemented as shown in FIGS. 4A-B, using plates 404 and 408. The upper-column electron optics 600 thus may be implemented by replacing the plate 402 in the upper-column electron optics 400 (FIGS. 4A-4C) with the first and second plates 602 and 606, in accordance with some embodiments. In this example, the plate 404 is a third plate and the plate 408 is a fourth plate. The third plate 404 is disposed between the second plate 606 and the fourth plate 408. The fourth plate 408 is disposed between the third plate 404 and the magnetic lens 414. The second plate 606 is disposed between the first plate 602 and the third plate 404.

The first plate 602, second plate 606, and third plate 404 compose a lens array disposed between the aperture array 110 and the first global lens 306 (although the third plate 404 is considered part of both the lens array and the first global lens 306). The lens array may be configurable to operate as a defocusing lens that defocuses the plurality of electron beamlets 612. The first global lens 306 may be configurable to operate as a focusing lens that focuses the plurality of electron beamlets 612 as defocused by the lens array. These functions are achieved through suitable biasing: the aperture array 110 and first plate 602 are grounded, the second plate 606 is biased with $V_{FCC}$, the third plate 404 is biased with negative voltage $V_{IMG}$, and the fourth plate 408 is grounded. The second plate 606 is thus configurable to be biased with $V_{FCC}$, and the third plate 404 is configurable to be negatively biased with $V_{IMG}$, in accordance with some embodiments.

Figure 7:
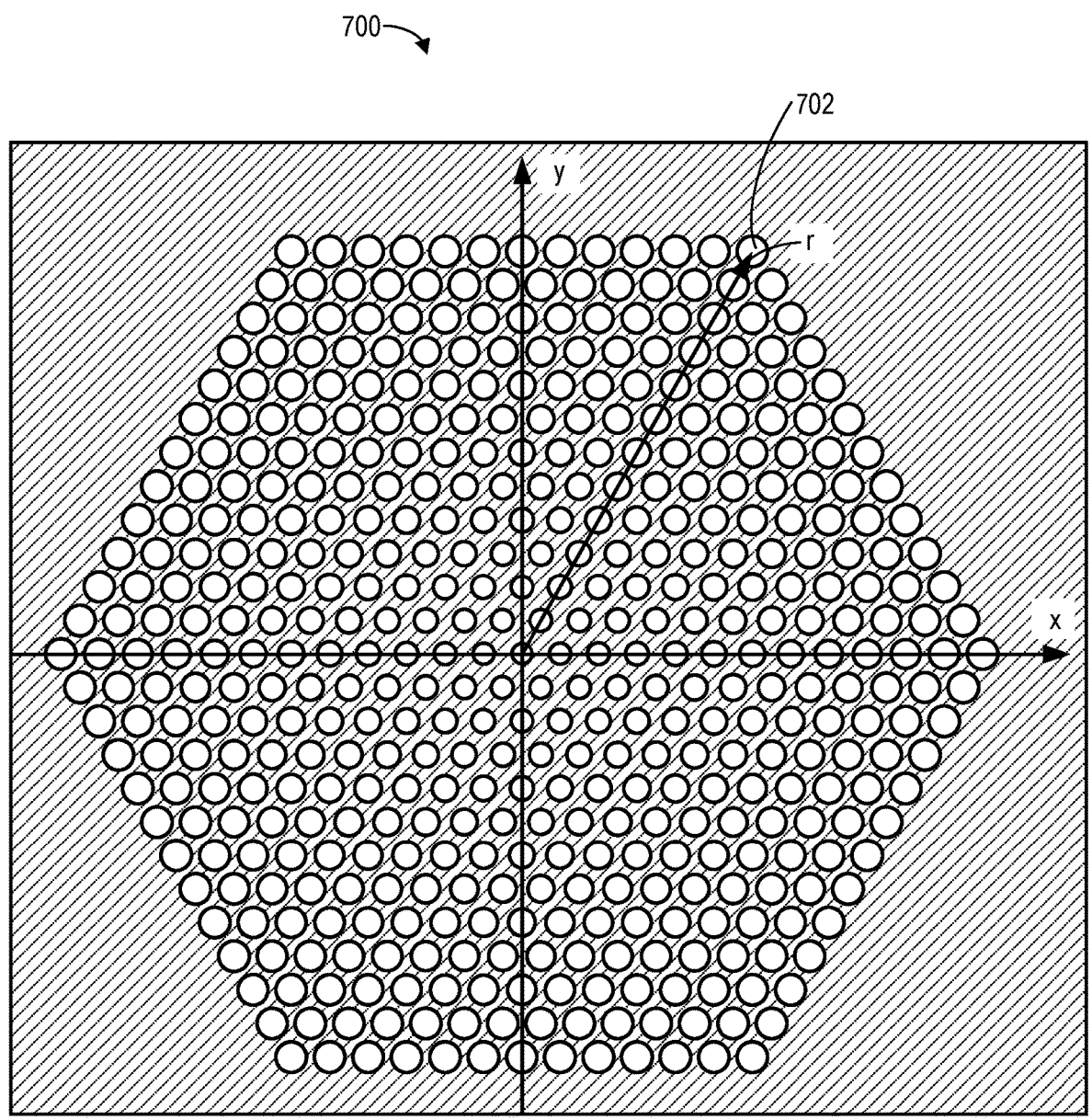
FIG. 7 shows a plate that may be used as the first plate and the second plate in the upper-column electron optics of FIG. 6, in accordance with some embodiments.

In some embodiments, bores sizes of respective bores in the first plurality of bores 604 and in the second plurality of bores 608 increase with increasing values of a radial coordinate for the respective bores. The radial coordinate is measured from a center of the pattern of bores. FIG. 7 shows a plate 700 that may be used as the first plate 602 and the second plate 606, in accordance with some embodiments. The bores 702 in the plate 700 are thus examples of the first plurality of bores 604 and the second plurality of bores 608. The bore sizes (e.g., diameters) of the bores 702 in the plate 700 are variably distributed: the bore sizes increase with increasing distance from the origin (i.e., the intersection of the x- and y-axes) and thus with increasing value of a radial coordinate r. In the example of FIG. 7, the bore sizes increase as a linear function of (i.e., in a linear relation with) the radial coordinate. Other examples are possible. The smaller the bore size, the stronger the focusing strength will be, and the larger the bore size, the weaker the focusing strength will be.

This difference in focusing strength causes the virtual object position of each electron beamlet 312 to be different when $V_{FCC}$ is zero, as shown in FIG. 6 by the differing optical-axis coordinates $zo_0$, $zo_1$, and $zo_2$ for respective virtual objects corresponding to electron beamlets 612-3, 612-2, and 612-1. The images of the virtual objects located at $zo_0$, $zo_1$, and $zo_2$ have respective optical-axis coordinates $zi_0$, $zi_1$ and $zi_2$ on the image side of the first global lens 306 (FIG. 6). With $V_{FCC}$ is zero, the electron beamlets 312 are under-focused by the first global lens 306: the image positions $zi_0$, $zi_1$ and $zi_2$ are on the right size of the intermediate image plane (IIP) 616, as FIG. 6 shows, with defocus relations $(zi_0\text{-IIP})>(zi_1\text{-IIP})>(zi_2\text{-IIP})>0$. For a certain optimized value of $V_{FCC}$ (negative or positive) as applied to the second plate 606, however, the defocus relations become $(zi_0\text{-IIP})=(zi_1\text{-IIP})=(zi_2\text{-IIP})$, such that the image positions for the plurality of electron beamlets 612 are equal. By optimally adjusting the negative voltage $V_{IMG}$ as applied to the third plate 404, the defocus relations become $(zi_0\text{-IIP})=(zi_1\text{-IIP})=(zi_2\text{-IIP})=0$, such that the image positions for the plurality of electron beamlets 612 are all in the intermediate image plane 616 and the field curvatures of all of the electron beamlets 612 are corrected.

FIGS. 8A-8C and 9 illustrate the correction of field curvatures in accordance with the computer-simulated operation of the upper-column electron optics 600 in accordance with some embodiments. For these simulation results, the first global lens 306 is implemented using the plates 404 and 408 (FIGS. 4A-4B) and the second global lens 310 (FIG. 3, not shown in FIG. 6 for simplicity) is implemented using the magnetic lens 414.

Figure 8C:
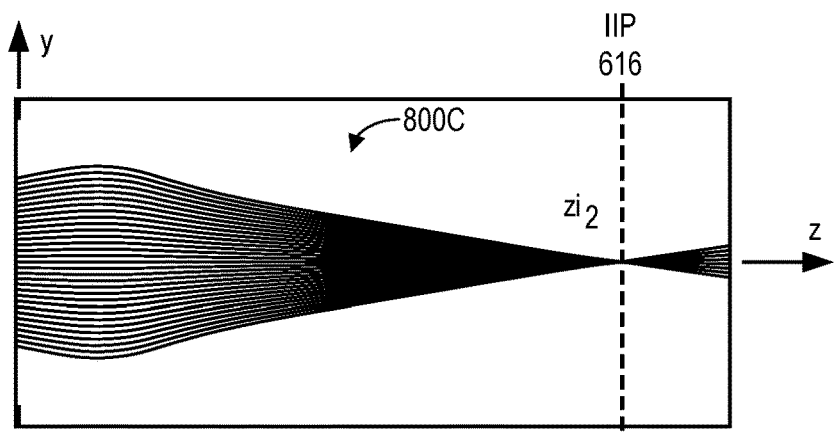
FIGS. 8A-8C show projections of three respective electron beamlets with field-curvature correction, in accordance with some embodiments.
Figure 8B:
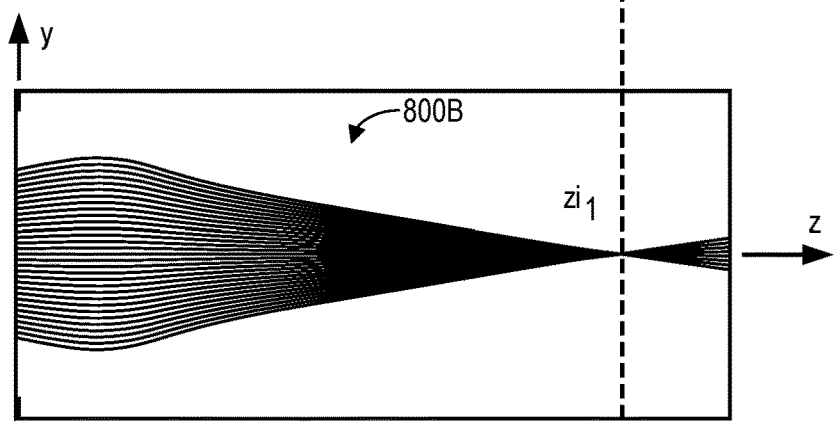
Figure 8A:
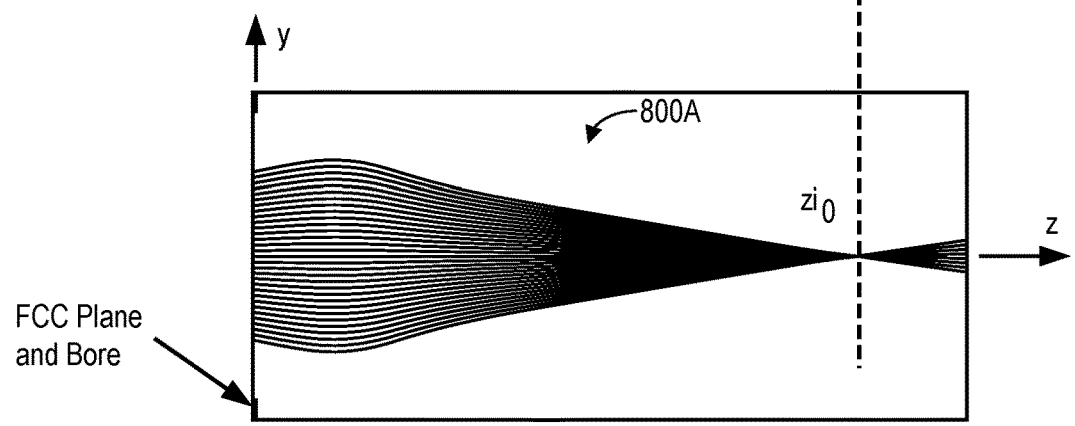

FIGS. 8A-8C show projections 800A, 800B, and 800C on the y-z plane of three respective electron beamlets 612-3, 612-2, and 612-1 with field-curvature correction, in accordance with some embodiments. Deflection of the electron beamlets 612-1, 612-2, and 612-3 occurs in the x-z plane. The y-axis corresponds to the second plate 606 and the second plurality of bores 608. The image positions of the three electron beamlets 612-1, 612-2, and 612-3 are $zi_2$, $zi_1$, and $zi_0$, respectively. Each projection 800A, 800B, and 800C includes multiple computer ray-tracing simulations of electron trajectories. To determine the desired value of $V_{FCC}$ used in the simulations for FIGS. 8A-8C, $V_{FCC}$ is increased in steps (e.g., up to hundreds of volts). With each step, the residual field curvatures $(zi_0\text{-IIP})>(zi_1\text{-IIP})>(zi_2\text{-IIP})$ are reduced until $(zi_0\text{-IIP})\approx(zi_1\text{-IIP})\approx(zi_2\text{-IIP})\approx 0$ (e.g., the image positions of the electron beamlets 612-1, 612-2, and 612-3 are substantially within the intermediate image plane 616, to within acceptable error).

As FIGS. 8A-8C show, the electron beamlets 612-1, 612-2, and 612-3 are first defocused by the lens array that includes the first plate 602, second plate 606, and third plate 404. The electron beamlets 612-1, 612-2, and 612-3 are then focused (and deflected) by the first global lens 306. The electron beamlets 612-1, 612-2, and 612-3 are well-focused at $zi_2$, $zi_1$, and $zi_0$, showing good image-forming performance with removal of spherical aberrations. This image-forming performance is achieved using only two voltages, $V_{IMG}$ and $V_{FCC}$ (plus biasing for the second global lens 310) in accordance with some embodiments, thus allowing the upper-column electron optics 600 to be implemented with few power supplies and simple power routing.

Figure 9:
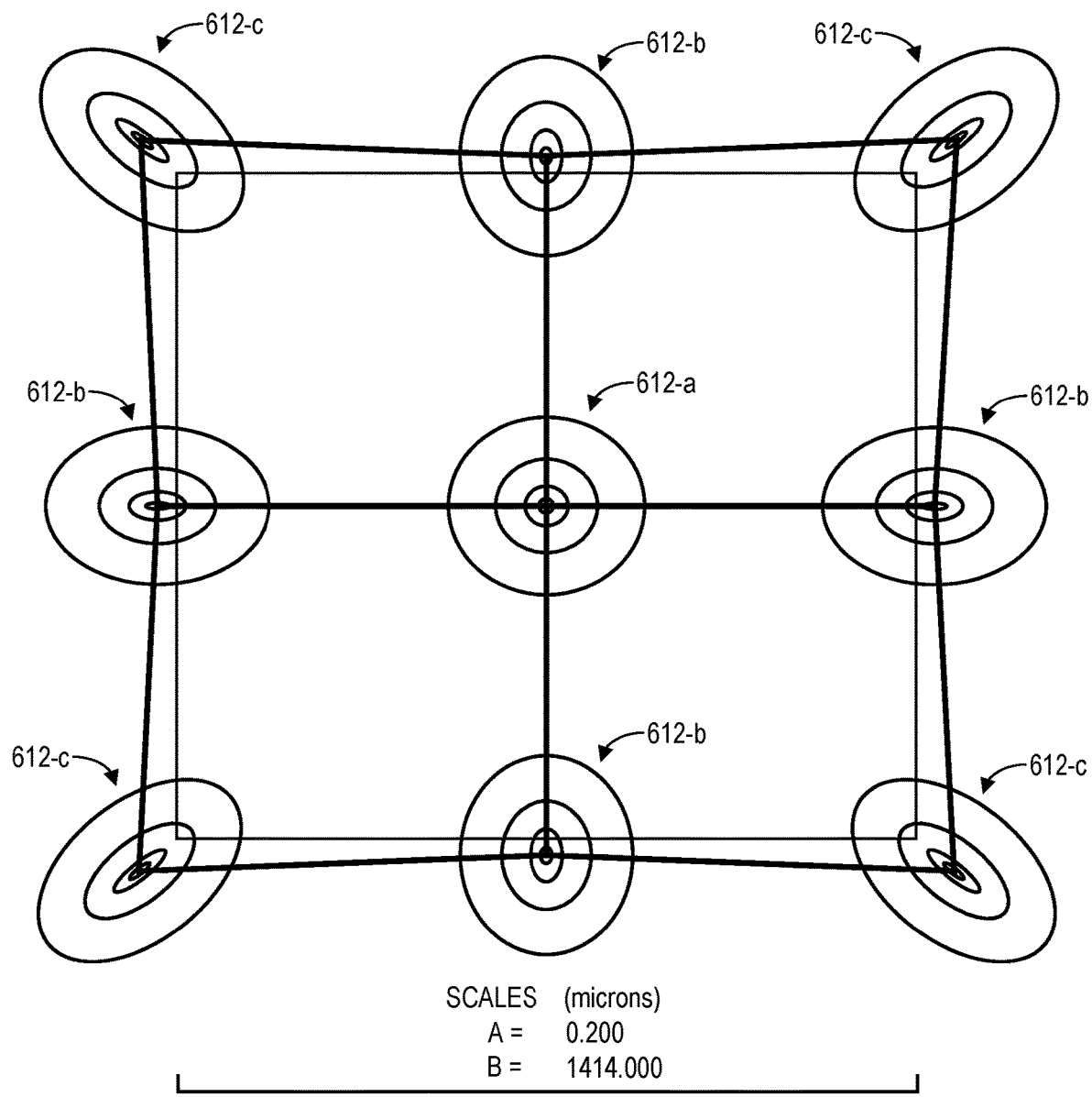
FIG. 9 shows simulated spot sizes across a field of view with field-curvature correction, in accordance with some embodiments.

FIG. 9 shows simulated spot sizes across a field of view with field-curvature correction, in accordance with some embodiments. The spot sizes include spot sizes for a central electron beamlet 612-a, the farthest electron beamlets 612-b along the x- and y-axes, and the farthest-corner electron beamlets 612-c. As for FIG. 5, FIG. 9 has two scales: a first scale for the electron distribution in each beamlet 312 and a second, larger scale for the distance between the electron beamlets 312. The first scale in FIG. 9 is one-fifth the first scale in FIG. 5. With elimination of the field curvatures, the spot sizes of the electron beamlets 612-b and 612-c are close to the spot size of the central electron beamlet 612-a, although there exist certain astigmatism blurs and distortions. The distortions may be less than pixel sizes. FIG. 9 thus shows significant improvement in electron-beamlet resolution compared to FIG. 5.

Field curvatures also exist in the lower-column electron optics 128 (FIG. 1), from the intermediate image plane to the wafer (or other substrate) being inspected. Off-axis aberrations including field curvatures in the lower-column electron optics 128 may be minimized by optimizing the projection optical demagnification. For example, the optical demagnification may be in a range, or approximate range, of 5-10×, depending on the landing energy for specific uses. Accordingly, the $FOV_i$ in the plane of the wafer 124 may be in the range, or approximate range, of 282 um×282 um to 141 um×141 um for $FOV_o$ in the intermediate image plane of 1414 um×1414 um. The field curvatures in the lower-column electron optics 128 for such $FOV_i$ values may be significant. The upper-column electron optics 600 (FIG. 6) may be used to correct for the field curvatures in the lower-column electron optics 128 by selecting a value of $V_{FCC}$ that over-corrects for field curvature in the intermediate image plane 616, such that $(zi_2\text{-IIP})>(zi_1\text{-IIP})>(zi_0\text{-IIP})=0$. The amounts of over-correction $(zi_2\text{-IIP})$ and $(zi_1\text{-IIP})$ compensate for the field-curvature distances in the lower-column electron optics 128 for the respective electron beamlets 612-1 and 612-2.

In some embodiments, to improve the ultimate focusing of the electron beamlets 112 (FIG. 1), the electron-beam device 100 (FIG. 1) may be replace with an electron-beam device that uses a focusing lens array to focus the plurality of electron beamlets and uses a first global lens (also referred to as a global defocusing lens or GDL) to defocus the plurality of electron beamlets. The focusing lens array thus adjusts the focus of the plurality of electron beamlets in a first manner (i.e., by focusing them) and the first global lens thus adjusts the focus of the plurality of electron beamlets in a second manner that is opposite to the first manner (i.e., by defocusing them).

Figure 10:
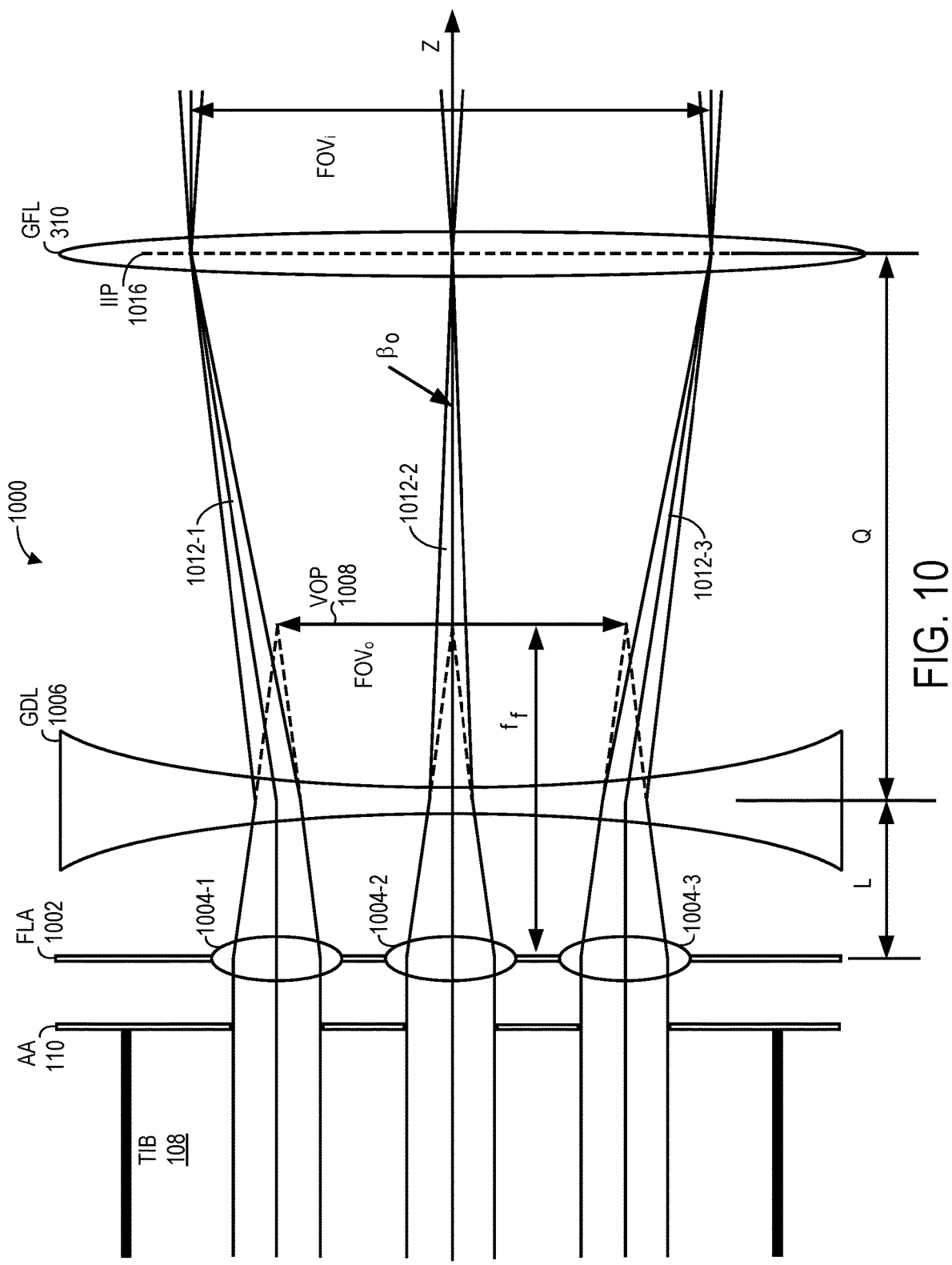
FIG. 10 shows a portion of the upper-column electron optics of an electron-beam device (e.g., SEM) that generates multiple electron beams, uses a focusing lens array to focus the electron beams, and uses a global defocusing lens to defocus the electron beams, in accordance with some embodiments.

FIG. 10 shows a portion of the upper-column electron optics 1000 of such an electron-beam device (e.g., SEM) in accordance with some embodiments. In the upper-column electron optics 1000, the aperture array 110 (e.g., the plate 200, FIG. 2) divides the electron beam 108, which is a telecentric illumination beam (TIB) and thus is collimated, into a plurality of electron beamlets 1012 with trajectories parallel to the optical axis. (Three electron beamlets 1012-1 through 1012-3 are shown in FIG. 10 for simplicity. The upper-column electron optics 1000 may also include the emitter tip 102, gun lens 104, and beam-limiting aperture 106 of FIG. 1, which are not shown for simplicity.) The electron beamlets 1012 are then separately focused by respective focusing lenses 1004 in a focusing lens array (FLA) 1002. (Three lenses 1004-1 through 1004-3 corresponding to the electron beamlets 1012-1 through 1012-3 are shown in FIG. 10 for simplicity.) The focusing lens array 1002 focuses the electron beamlets 1012 onto a virtual object plane (VOP) 1008 between a first global lens 1006 and a second global lens 310 (i.e., between the first global lens 1006 and an intermediate image plane 1016). The first global lens (i.e., GDL) 1006 then defocuses and deflects the focused electron beamlets 1012. The deflected electron beamlets 1012 form an image at the intermediate image plane 1016. The focusing performed by the focusing lens array 1002 is stronger than the defocusing performed by the first global lens 1006, allowing the electron beamlets 1012 to be image-formed in the intermediate image plane 1016. The second global lens 310 collimates the deflected beamlets 1012 to telecentrically illuminate the lower-column electron optics 128 (FIG. 1, not shown in FIG. 10).

The focusing lens array 1002 is disposed between the aperture array 110 and the first global lens 1006 along the optical axis. The first global lens 1006 is disposed between the focusing lens array 1002 and the second global lens 310 along the optical axis. The second global lens 310 is disposed between the first global lens 1006 and the lower-column electron optics 128 along the optical axis.

The defocusing field of the first global lens 1006 deflects the electron beamlets 1012 that are off the optical axis (e.g., electron beamlets 1012-1 and 1012-3 but not 1012-2), generating a larger $FOV_i$ in the intermediate image plane 1016 than the $FOV_o$ in the virtual object plane. The projection optical magnification is therefore greater than 1×:

$$M = FOV_i/FOV_o > 1\times \quad (6)$$

In some embodiments, the upper-column electron optics 1000 are implemented using the upper-column electron optics 300 (FIG. 3), including the upper-column electron optics 400 (FIGS. 4A-4B), by making $V_{IMG}$ positive: a positive voltage $V_{IMG}$ is applied to the plate 404, and the other components are biased as shown in FIG. 4A. By changing $V_{IMG}$ from negative to positive, the defocusing lens array 302 (FIG. 3) becomes the focusing lens array 1002 and the global imaging lens (i.e., first global lens 306) becomes the global defocusing lens (i.e., first global lens 1006). The plate 404 thus may be configurable to be positively biased.

In some other embodiments, the upper-column electron optics 1000 are implemented using the upper-column electron optics 600 (FIG. 6), including the plate 404 and the plate 408 (FIG. 4A), by making $V_{IMG}$ positive. The aperture array 110 and first plate 602 are grounded, the second plate 606 is biased with an auxiliary voltage $V_{FCC}$ (e.g., on the order of hundreds of volts), the third plate 404 is biased with a positive voltage $V_{IMG}$, and the fourth plate 408 is grounded.

FIG. 11 is a flowchart illustrating a method 1100 of creating multiple electron beams in an electron-beam device (e.g., a SEM), in accordance with some embodiments. The method 1100 may be performed using the upper-column optics in the electron-beam device (e.g., upper column optics 300, FIG. 3; 400, FIGS. 4A-4C; 600, FIG. 6; and/or 1000, FIG. 10).

In the method 1100, an electron beam (e.g., TIB 108, FIGS. 3, 4C, 6, and/or 10) is divided (1102) into a plurality of electron beamlets (e.g., electron beamlets 312, FIG. 3; 612, FIG. 6; or 1012, FIG. 10) using an aperture array (e.g., aperture array 110, FIGS. 3, 4A-4C, 6, and/or 10) (e.g., plate 200, FIG. 2).

The focus of the plurality of electron beamlets is adjusted (1104) using a lens array (e.g., defocusing lens array 302, FIG. 3; the lens array of FIG. 6; focusing lens array 1002, FIG. 10) that includes a plurality of lenses. Respective lenses of the plurality of lenses are used to adjust the focus of respective electron beamlets of the plurality of electron beamlets. In some embodiments (e.g., as in FIGS. 3 and 6), the plurality of electron beamlets is defocused (1106). Alternatively (e.g., as in FIG. 10), the plurality of electron beamlets is focused (1108).

The focus of the plurality of electron beamlets is adjusted (1110) using a first global lens (e.g., first global lens 306, FIG. 3 or 6; first global lens 1006, FIG. 10). The first global lens adjusts the focus of the plurality of electron beamlets in a manner opposite to the lens array (but not with an equal magnitude; the focusing may be stronger than the defocusing). In some embodiments (e.g., as in FIGS. 3 and 6), the plurality of electron beamlets, as defocused by the lens array in step 1106, is focused (1112) by the first global lens. Alternatively (e.g., as in FIG. 10), the plurality of electron beamlets, as focused by the lens array in step 1108, is defocused (1114) by the first global lens.

The plurality of electron beamlets is collimated (1116) and provided (1118) to lower-column electron optics (e.g., lower-column electron optics 128, FIG. 1) of the electron-beam device. For example, a second global lens (e.g., second global lens 310, FIG. 3 or 10) (e.g., magnetic lens 414, FIG. 4A) collimates the plurality of electron beamlets and provides the plurality of electron beamlets to the lower-column electron optics.

The method 1100 allows multiple electron beamlets (e.g., over one hundred electron beamlets, such as 331 beamlets in accordance with the plate 200, FIG. 2) to be generated with high resolution using relatively simple optical designs with few power supplies and a low risk of arcing.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electron-beam device, comprising upper-column electron optics and lower-column electron optics, the upper-column electron optics comprising:
   an aperture array to divide an electron beam into a plurality of electron beamlets;
   a lens array comprising a plurality of lenses to adjust the focus of the plurality of electron beamlets, wherein respective lenses of the plurality of lenses are to adjust the focus of respective electron beamlets of the plurality of electron beamlets; and
a first global lens to adjust the focus of the plurality of electron beamlets in a manner opposite to the lens array;
wherein the lens array is disposed between the aperture array and the first global lens.

2. The electron-beam device of claim 1, further comprising a second global lens to collimate the plurality of beamlets and provide the plurality of beamlets to the lower-column electron optics, wherein
the first global lens is disposed between the lens array and the second global lens.

3. The electron-beam device of claim 2, wherein the second global lens comprises a magnetic lens.

4. The electron-beam device of claim 2, wherein the lower-column electron optics comprise a transfer lens and an objective lens, the transfer lens being configured to produce a cross-over of the electron beamlets between the transfer lens and the objective lens.

5. The electron-beam device of claim 1, wherein:
the lens array comprises:
a first plate having a plurality of bores corresponding to respective apertures in the aperture array, and
a second plate having a bore to allow passage of the plurality of beamlets,
wherein the first plate is disposed between the aperture array and the second plate; and
the first global lens comprises:
the second plate, and
a third plate having a bore to allow passage of the plurality of beamlets,
wherein the second plate is disposed between the first plate and the third plate.

6. The electron-beam device of claim 5, wherein:
the plurality of bores in the first plate is aligned with the respective apertures in the aperture array; and
the plurality of bores in the first plate has a bore size that is larger than an aperture size of the respective apertures in the aperture array.

7. The electron-beam device of claim 5, wherein:
the aperture array is grounded;
the first plate is grounded;
the second plate is configurable to be negatively biased; and
the third plate is grounded.

8. The electron-beam device of claim 5, wherein:
the aperture array is grounded;
the first plate is grounded;
the second plate is configurable to be positively biased; and
the third plate is grounded.

9. The electron-beam device of claim 5, wherein the first plate further has a plurality of dummy holes surrounding the plurality of bores, wherein the plurality of dummy holes does not correspond to respective apertures in the aperture array.

10. The electron-beam device of claim 1, wherein:
the lens array comprises:
a first plate having a first plurality of bores corresponding to respective apertures in the aperture array,
a second plate having a second plurality of bores corresponding to the first plurality of bores and the respective apertures in the aperture array, and
a third plate having a bore to allow passage of the plurality of beamlets,
wherein the first plate is disposed between the aperture array and the second plate, and the second plate is disposed between the first plate and the third plate; and
the first global lens comprises:
the third plate, and
a fourth plate having a bore to allow passage of the plurality of beamlets,
wherein the third plate is disposed between the second plate and the fourth plate.

11. The electron-beam device of claim 10, wherein:
the first plurality of bores and the second plurality of bores are aligned with each other and with the respective apertures in the aperture array; and
a respective bore in the first plurality of bores and a respective bore in the second plurality of bores have a bore size that is larger than an aperture size of a respective aperture in the aperture array.

12. The electron-beam device of claim 11, wherein bore sizes of respective bores in the first plurality of bores and in the second plurality of bores increase with increasing values of a radial coordinate for the respective bores.

13. The electron-beam device of claim 10, wherein:
the aperture array is grounded;
the first plate is grounded;
the second plate is configurable to be biased with an auxiliary voltage;
the third plate is configurable to be negatively biased; and
the fourth plate is grounded.

14. The electron-beam device of claim 10, wherein:
the aperture array is grounded;
the first plate is grounded;
the second plate is configurable to be biased with an auxiliary voltage;
the third plate is configurable to be positively biased; and
the fourth plate is grounded.

15. The electron-beam device of claim 1, wherein:
the lens array is configurable to defocus the plurality of electron beamlets; and
the first global lens is configurable to focus the plurality of electron beamlets as defocused by the lens array.

16. The electron-beam device of claim 1, wherein:
the lens array is configurable to focus the plurality of electron beamlets; and
the first global lens is configurable to defocus the plurality of electron beamlets as focused by the lens array.

17. A method, comprising, in the upper-column electron optics of an electron-beam device:
dividing an electron beam into a plurality of electron beamlets using an aperture array;
adjusting the focus of the plurality of electron beamlets using a lens array comprising a plurality of lenses, comprising using respective lenses of the plurality of lenses to adjust the focus of respective electron beamlets of the plurality of electron beamlets; and
adjusting the focus of the plurality of electron beamlets using a first global lens, wherein:
the first global lens adjusts the focus of the plurality of electron beamlets in a manner opposite to the lens array; and
the lens array is disposed between the aperture array and the first global lens.

18. The method of claim 17, further comprising, in the upper-column electron optics:
collimating the plurality of beamlets; and
providing the collimated plurality of beamlets to lower-column electron optics of the electron-beam device.

19. The method of claim 17, wherein:

adjusting the focus of the plurality of electron beamlets using the lens array comprises defocusing the plurality of electron beamlets; and adjusting the focus of the plurality of electron beamlets using the first global lens comprises focusing the plurality of electron beamlets as defocused by the lens array.

20. The method of claim 17, wherein:

adjusting the focus of the plurality of electron beamlets using the lens array comprises focusing the plurality of electron beamlets; and adjusting the focus of the plurality of electron beamlets using the first global lens comprises defocusing the plurality of electron beamlets as focused by the lens array.

* * * * *